(12) United States Patent
Huang et al.

(10) Patent No.: US 11,335,596 B2
(45) Date of Patent: May 17, 2022

(54) SELECTIVE DEPOSITION FOR INTEGRATED CIRCUIT INTERCONNECT STRUCTURES

(71) Applicant: Taiwan Semiconductor Manufacturing Co., Ltd., Hsinchu (TW)

(72) Inventors: Hsin-Yen Huang, New Taipei (TW); Shao-Kuan Lee, Hsinchu (TW); Cheng-Chin Lee, Hsinchu (TW); Hai-Ching Chen, Hsinchu (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 93 days.

(21) Appl. No.: 16/577,079

(22) Filed: Sep. 20, 2019

(65) Prior Publication Data

US 2020/0135557 A1 Apr. 30, 2020

Related U.S. Application Data

(60) Provisional application No. 62/752,729, filed on Oct. 30, 2018.

(51) Int. Cl.
*H01L 21/768* (2006.01)
*H01L 23/522* (2006.01)
*H01L 23/532* (2006.01)

(52) U.S. Cl.
CPC .. *H01L 21/76879* (2013.01); *H01L 21/76802* (2013.01); *H01L 21/76805* (2013.01);
(Continued)

(58) Field of Classification Search
CPC ......... H01L 21/76879; H01L 21/76829; H01L 21/76802; H01L 23/5226; H01L 23/53295;
(Continued)

(56) References Cited

U.S. PATENT DOCUMENTS 9,520,362 B2 12/2016 Lin et al.
9,613,856 B1 4/2017 Yang et al.
(Continued)

*Primary Examiner* — Dao H Nguyen
*Assistant Examiner* — Juanita B Rhodes
(74) *Attorney, Agent, or Firm* — Haynes and Boone, LLP

(57) ABSTRACT

Examples of an integrated circuit with an interconnect structure and a method for forming the integrated circuit are provided herein. In some examples, the method includes receiving a workpiece that includes a substrate and an interconnect structure. The interconnect structure includes a first conductive feature disposed within a first inter-level dielectric layer. A blocking layer is selectively formed on the first conductive feature without forming the blocking layer on the first inter-level dielectric layer. An alignment feature is selectively formed on the first inter-level dielectric layer without forming the alignment feature on the blocking layer. The blocking layer is removed from the first conductive feature, and a second inter-level dielectric layer is formed on the alignment feature and on the first conductive feature. The second inter-level dielectric layer is patterned to define a recess for a second conductive feature, and the second conductive feature is formed within the recess.

20 Claims, 14 Drawing Sheets

(52) U.S. Cl.
    CPC .. *H01L 21/76807* (2013.01); *H01L 21/76829* (2013.01); *H01L 21/76832* (2013.01); *H01L 21/76834* (2013.01); *H01L 21/76849* (2013.01); *H01L 21/76856* (2013.01); *H01L 21/76897* (2013.01); *H01L 23/5226* (2013.01); *H01L 23/53295* (2013.01)

(58) Field of Classification Search
    CPC ......... H01L 21/76849; H01L 21/76856; H01L 21/76834; H01L 21/76832; H01L 21/76897; H01L 21/76805; H01L 21/76807; H01L 21/76895
    USPC ....................................................... 257/774
    See application file for complete search history.

(56) References Cited

U.S. PATENT DOCUMENTS

| | | | |
|---|---|---|---|
| 9,716,032 B2 | 7/2017 | Tang et al. | |
| 9,972,529 B2 | 5/2018 | Yang et al. | |
| 10,163,691 B2 | 12/2018 | Shih et al. | |
| 10,170,322 B1 | 1/2019 | Cheng et al. | |
| 2007/0200241 A1* | 8/2007 | Wu | H01L 23/53295 257/758 |
| 2012/0319278 A1* | 12/2012 | Lin | H01L 21/76834 257/751 |
| 2019/0295890 A1* | 9/2019 | Clark | H01L 21/67023 |

\* cited by examiner

SELECTIVE DEPOSITION FOR INTEGRATED CIRCUIT INTERCONNECT STRUCTURES

PRIORITY DATA

The present application claims the benefit of U.S. Provisional Application No. 62/752,729, entitled "Selective Deposition for Integrated Circuit Interconnect Structures," filed Oct. 30, 2018, which is herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

Advances have been made to device fabrication as well as to the fabrication of the network of conductors that couple them. In that regard, an integrated circuit may include an interconnect structure to electrically couple the circuit devices (e.g., Fin-like Field Effect Transistors (FinFETs), planar FETs, memory devices, Bipolar-Junction Transistors (BJTs), Light-Emitting Diodes (LEDs), other active and/or passive devices, etc.). The interconnect structure may include any number of dielectric layers stacked vertically with conductive lines running horizontally within the layers. Vias may extend vertically to connect conductive lines in one layer with conductive lines in an adjacent layer. Similarly, contacts may extend vertically between the conductive lines and substrate-level features. Together, the lines, vias, and contacts carry signals, power, and ground between the devices and allow them to operate as a circuit.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
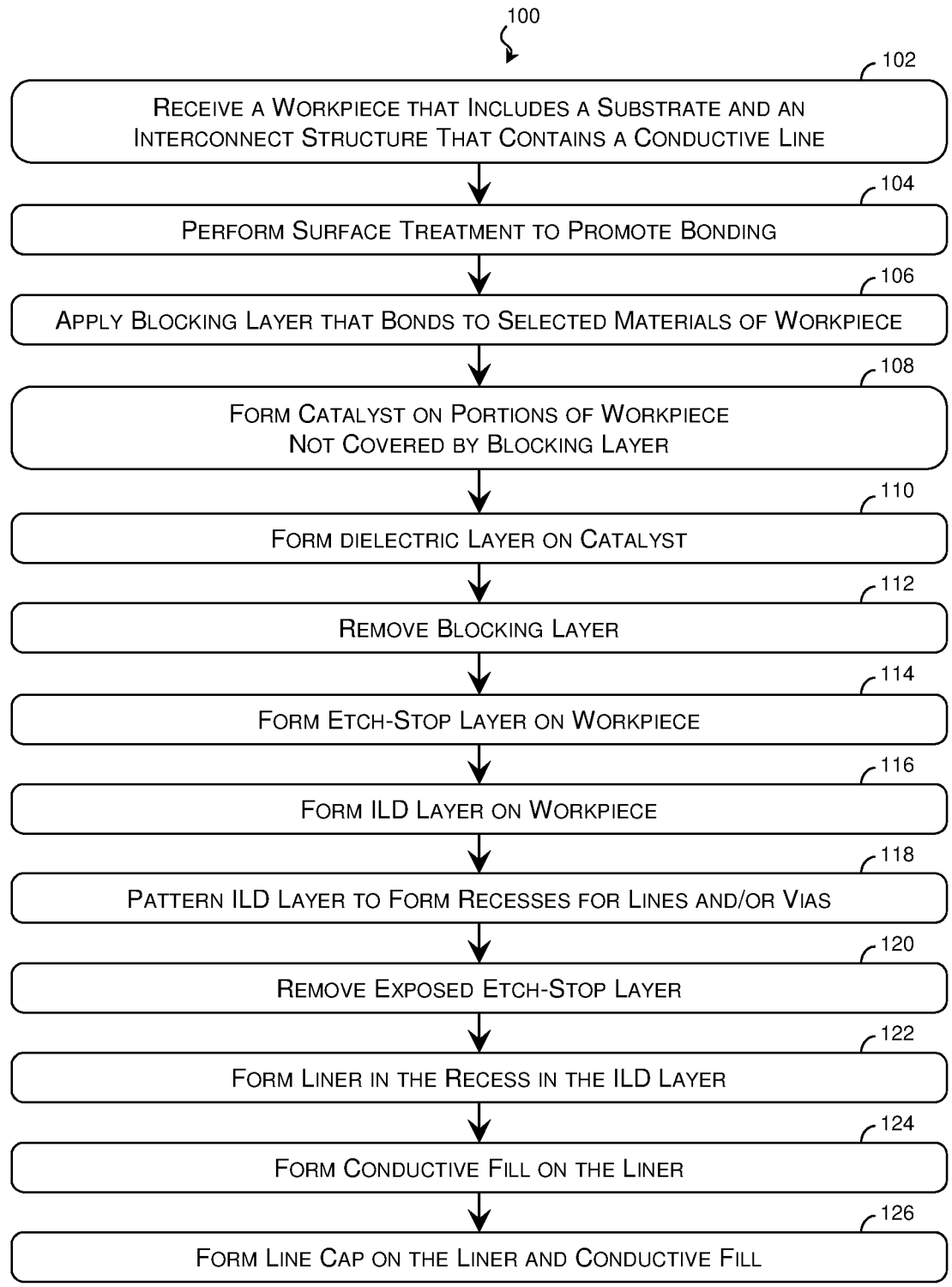
FIG. 1 is a flow diagram of a method of fabricating a workpiece with an interconnect structure according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

Integrated circuits include an ever-increasing number of active and passive circuit devices formed on a substrate or wafer with a complex interconnect structure disposed on top to electrically couple the devices. While there have been significant advances in fabrication and in miniaturizing the devices, the interconnect has generally resisted efforts to shrink it. As merely one issue, as interconnect features become smaller, they provide smaller landing areas for other features, such as vias, to couple to. Vias that are offset and land too close to adjacent conductive lines may short, may create leakage paths, and may cause line breakdown over time (e.g., time-dependent dielectric breakdown). Accordingly, as interconnect feature size shrinks, the tolerances for overlay errors is reduced as well. Furthermore, as the spacing between a via and an adjacent conductive line is reduced, parasitic capacitance between the two features may increase.

Some examples of the present technique address these issues and others by selectively depositing dielectric alignment features above and between the conductive features of a given layer. The alignment features self-align the vias that couple to the conductive features. By self-aligning the vias, the sensitivity of those processes that form the vias (e.g., photolithography) to overlay errors may be greatly reduced. By spacing the vias away from the adjacent conductive lines, the alignment features may also reduce parasitic capacitance. Furthermore, in some examples, the technique allows the use of a low-k dielectric material in the alignment features to further reduce parasitic capacitance. Some such examples use a deposition process specifically configured to deposit the alignment features on an inter-level dielectric without depositing the alignment feature material on the conductive features. In these ways and others, the technique allows smaller interconnect features to be formed with more reliably and regularity. It is noted, however, that these advantages are merely examples, and no particular advantage is required for any particular embodiment.

Figure 2A:
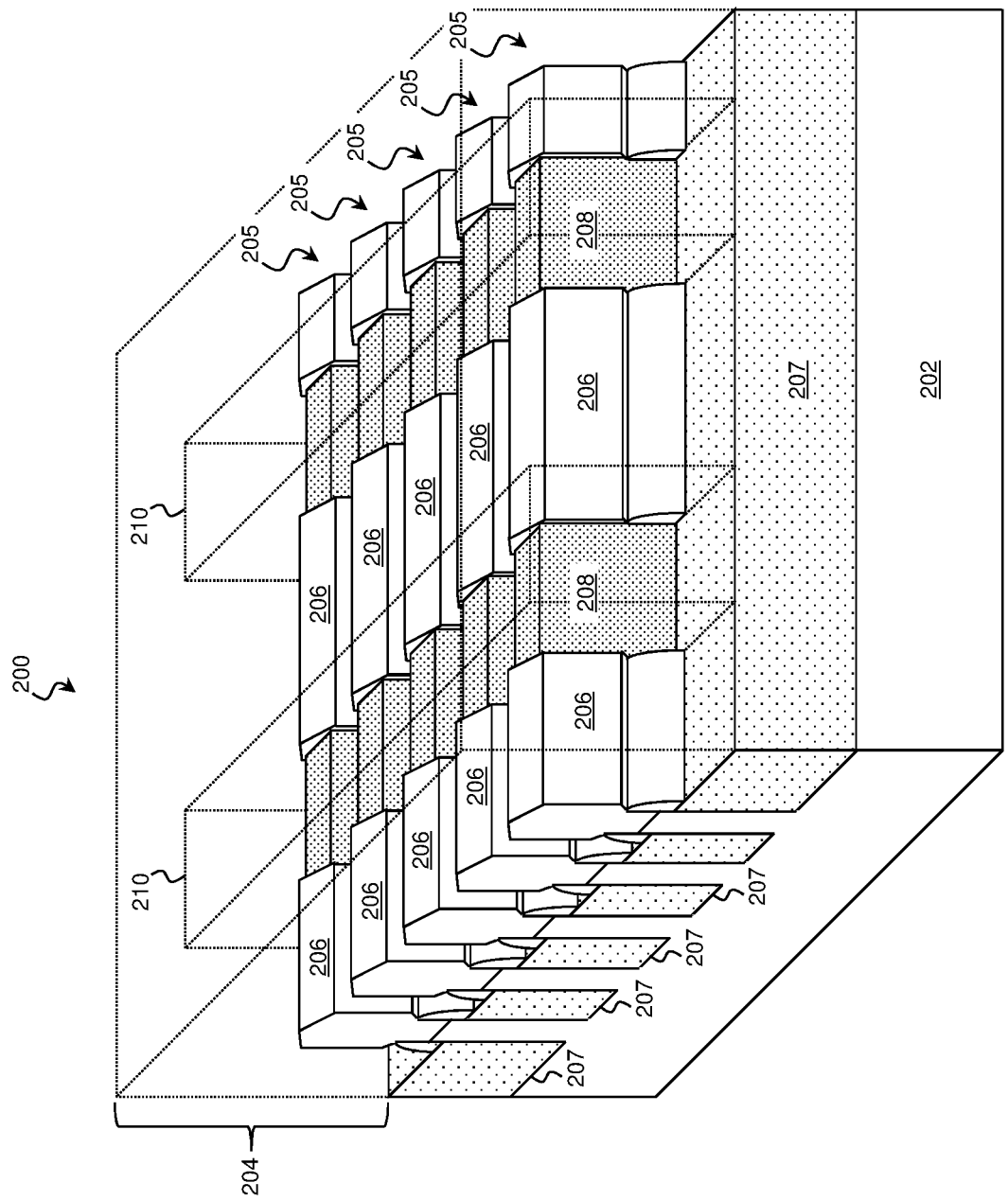
FIG. 2A is a perspective illustration of a workpiece undergoing a method of fabrication according to various aspects of the present disclosure.

The present disclosure provides examples of an integrated circuit that includes an interconnect structure. Examples of the circuit and a technique for forming the circuit are described with reference to FIGS. 1-12. In that regard, FIG. 1 is a flow diagram of a method 100 of fabricating a workpiece 200 with an interconnect structure according to various aspects of the present disclosure. Additional steps can be provided before, during, and after the method 100, and some of the steps described can be replaced or eliminated for other embodiments of the method 100. FIG. 2A is a perspective illustration of the workpiece 200 undergoing the method 100 of fabrication according to various aspects of the present disclosure. FIGS. 2B and 3A-12 are cross-sectional illustrations of the workpiece 200 undergoing the method 100 of fabrication according to various aspects of the present disclosure.

Figure 2B:
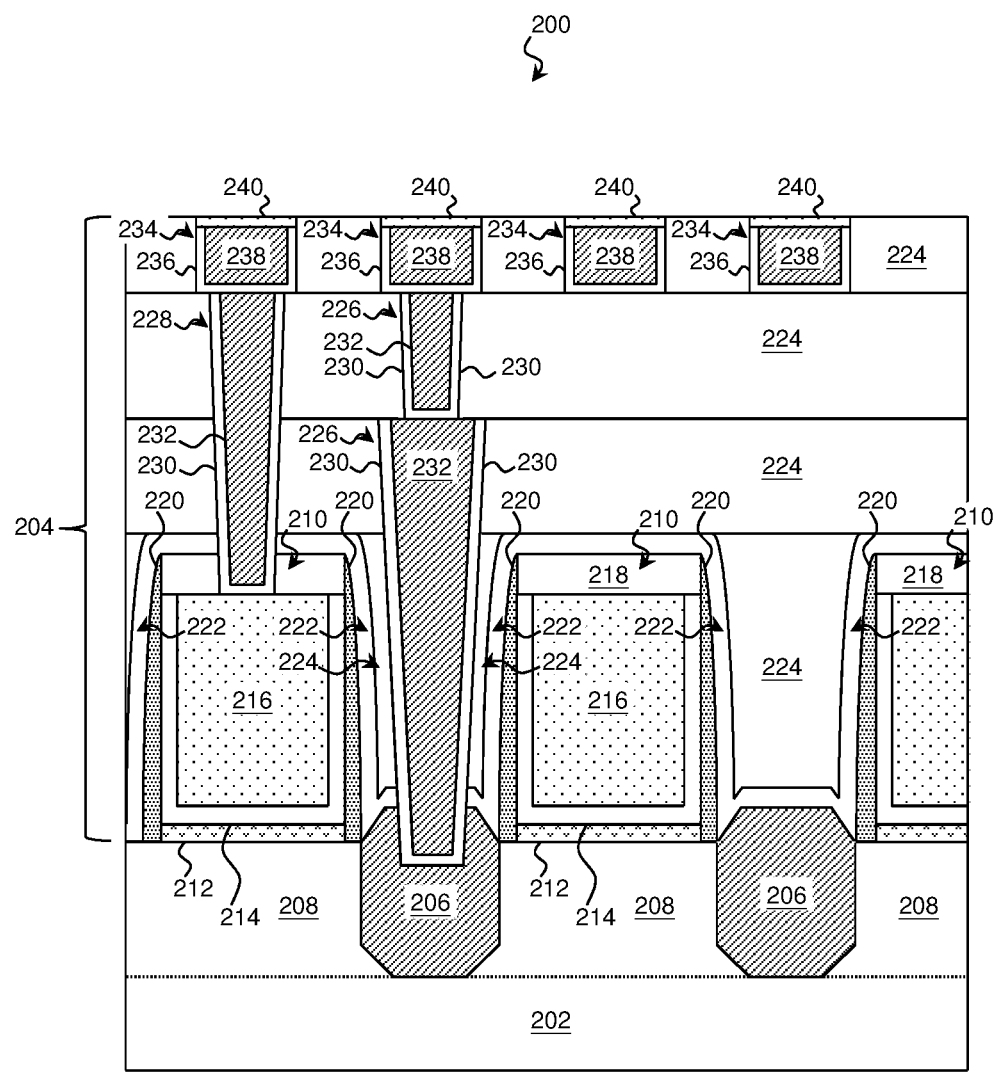
FIGS. 2B and 3A-12 are cross-sectional illustrations of a workpiece undergoing a method of fabrication according to various aspects of the present disclosure.

Referring to block 102 of FIG. 1 and to FIGS. 2A and 2B, a workpiece 200 is received that includes a substrate 202 and an interconnect structure 204 disposed over the substrate 202. The interconnect structure 204 is represented by a transparent marker in FIG. 2A to avoid obscuring the underlying structures of the substrate 202. The substrate 202 represents any structure upon which circuit devices may be formed. In various examples, the substrate 202 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be uniform in composition or may include various layers, some of which may be selectively etched to form fins. The layers may have similar or different compositions, and in various embodiments, some substrate layers have non-uniform compositions to induce device strain and thereby tune device performance. Examples of layered substrates include silicon-on-insulator (SOI) substrates 202. In some such examples, a layer of the substrate 202 may include an insulator such as a semiconductor oxide, a semiconductor nitride, a semiconductor oxynitride, a semiconductor carbide, and/or other suitable insulator materials.

Doped regions, such as wells, may be formed on the substrate 202. In that regard, some portions of the substrate 202 may be doped with p-type dopants, such as boron, $BF_2$, or indium while other portions of the substrate 202 may be doped with n-type dopants, such as phosphorus or arsenic; and/or other suitable dopants including combinations thereof.

A number of circuit devices may be formed on the substrate 202 such as Fin-like Field Effect Transistors (FinFETs), planar FETs, memory devices, Bipolar-Junction Transistors (BJTs), Light-Emitting Diodes (LEDs), other active and/or passive devices. In some examples, the devices to be formed on the substrate 202 extend out of the substrate 202. For example, FinFETs and/or other non-planar devices may be formed on device fins 205 disposed on the substrate 202. The device fins 205 are representative of any raised feature and include FinFET device fins 205 as well as fins 205 for forming other raised active and passive devices upon the substrate 202. The fins 205 may be similar in composition to the substrate 202 or may be different therefrom. For example, in some embodiments, the substrate 202 may include primarily silicon, while the fins 205 include one or more layers that are primarily germanium or a SiGe semiconductor. In some embodiments, the substrate 202 includes a SiGe semiconductor, and the fins 205 include a SiGe semiconductor with a different ratio of silicon to germanium than the substrate 202.

The fins 205 may be formed by etching portions of the substrate 202, by depositing various layers on the substrate 202 and etching the layers, and/or by other suitable techniques. For example, the fins 205 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the fins 205 and is patterned using a photolithography process. Spacers are formed alongside the patterned sacrificial layer using a self-aligned process. The sacrificial layer is then removed, and the remaining spacers are used to pattern the fins 205 by removing material of the substrate 202 that is not covered by the spacers so that the fins 205 remain.

The workpiece 200 may also include an isolation dielectric layer 207 disposed on the substrate 202 between the fins 205 to form isolation features (e.g., Shallow Trench Isolation features (STIs)). The isolation dielectric layer 207 may include a dielectric material such as a semiconductor oxide, a semiconductor nitride, a semiconductor oxynitride, a semiconductor carbide, a semiconductor carbonitride, a semiconductor oxycarbonitride, a metal oxide, etc., and in some examples, the isolation dielectric layer 207 includes multiple sublayers of different dielectric materials. The isolation dielectric layer 207 may be formed by any suitable process, and in some examples, the isolation dielectric layer 207 is deposited using Atomic Layer Deposition (ALD), Plasma Enhanced ALD (PEALD), Chemical Vapor Deposition (CVD), Plasma Enhanced CVD (PECVD), High-Density Plasma CVD (HDP-CVD), and/or other suitable deposition processes. Following deposition, the isolation dielectric layer 207 may be etched back so that the uppermost portions of the fins 205 protrude above the isolation dielectric layer 207. In various such examples, the fins 205 extend between about 100 nm and about 500 nm above the topmost surface of the isolation dielectric layer 207.

The fins 205 may include source/drain features 206 and channel regions 208 disposed between the source/drain features. The source/drain features 206 and the channel regions 208 may be doped to be of opposite type. For an n-channel device, the source/drain features 206 are doped with an n-type dopant and the channel region 208 is doped with a p-type dopant, and vice versa for an p-channel device.

One or more gate structures 210 may be disposed above and alongside the channel regions 208. The flow of carriers (electrons for an n-channel device and holes for a p-channel device) through the channel region between the source/drain features 206 is controlled by a voltage applied to the gate structures 210. To avoid obscuring other features of the workpiece 200, the gate structures 210 are represented by translucent markers in FIG. 2A.

Suitable gate structures 210 include both polysilicon and metal gates. An exemplary gate structure 210 includes an interfacial layer 212 disposed on the channel region 208 that contains an interfacial material, such as a semiconductor oxide, semiconductor nitride, semiconductor oxynitride, other semiconductor dielectric, other suitable interfacial materials, and/or combinations thereof. A gate dielectric 214 is disposed on the interfacial layer 212 and includes one or more dielectric materials such as a high-k dielectric material (e.g., $HfO_2$, HfSiO, HfSiON, HfTaO, HfTiO, HfZrO, zirconium oxide, aluminum oxide, hafnium dioxide-alumina ($HfO_2$—$Al_2O_3$) alloy, etc.), semiconductor oxide, semiconductor nitride, semiconductor oxynitride, semiconductor carbide, amorphous carbon, tetraethylorthosilicate (TEOS), other suitable dielectric material, and/or combinations thereof.

A gate electrode 216 is disposed on the gate dielectric 214 and includes layers of conductive materials. An exemplary gate electrode 216 includes a capping layer, one or more work function layers disposed on the capping layer, and an electrode fill disposed on the work function layer(s).

In some examples, the gate structure 210 includes a gate cap 218 on top of the gate dielectric 214 and the gate electrode 216. The gate cap 218 may include a dielectric material (e.g., a semiconductor oxide, a semiconductor nitride, a semiconductor oxynitride, a semiconductor carbide, a semiconductor oxycarbonitride, etc.), polysilicon, Spin-On Glass (SOG), TEOS, Plasma Enhanced CVD oxide (PE-oxide), High-Aspect-Ratio-Process (HARP)-formed oxide, and/or other suitable material.

Sidewall spacers 220 are disposed on the side surfaces of the gate structures 210 and are used to offset the source/drain features 206 and to control the source/drain junction profile. In various examples, the sidewall spacers 220 include one or more layers of dielectric materials, such as a semiconductor oxide, a semiconductor nitride, a semiconductor oxynitride, a semiconductor carbide, a semiconductor oxycarbonitride, SOG, TEOS, PE-oxide, HARP-formed oxide, and/or other suitable materials.

The workpiece 200 may also include a Bottom Contact Etch-Stop Layer (BCESL) 222 disposed on the source/drain features 206, on the gate structures 210, and alongside the sidewall spacers 220. The BCESL 222 may include a dielectric (e.g., a semiconductor oxide, a semiconductor nitride, a semiconductor oxynitride, a semiconductor carbide, etc.) and/or other suitable material. In various embodiments, the BCESL 222 includes SiN, SiO, SiON, and/or SiC.

The interconnect structure 204 electrically couples the circuit features such as the source/drain features 206 and the gate structures 210. The interconnect structure 204 includes a number of conductive features interspersed between layers of an Inter-Level Dielectric (ILD layers 224). The ILD layers 224 may comprise any suitable dielectric material, such as a semiconductor oxide, a semiconductor nitride, a semiconductor oxynitride, a semiconductor carbide, TEOS oxide, PhosphoSilicate Glass (PSG), BoroPhosphoSilicate Glass (BPSG), Fluorinated Silica Glass (FSG), carbon doped silicon oxide, Black Diamond®, Xerogel, Aerogel, amorphous fluorinated carbon, Parylene, BCB (bis-benzocyclobutenes), SILK® (a registered trademark of Dow Chemical, Midland, Mich.), polyimide, other suitable materials, and/or combinations thereof. The ILD layers 224 act to support and electrically isolate the conductive features.

The lowest ILD layers 224 of the interconnect structure 204 support and electrically isolate the gate structures 210 as well as contacts that couple to substrate features, such as source/drain contacts 226 and gate contacts 228 that extend to and electrically couple to the source/drain features 206 and gate structures 210, respectively. The contacts 226 and 228 may each include a contact liner 230 and a contact fill 232. The contact liner 230 may act as a seed layer when depositing the contact fill 232 and may promote adhesion of the contact fill 232 to the remainder of the workpiece 200. The contact liner 230 may also act a barrier that prevents material of the contact from diffusing into the workpiece 200. The contact liner 230 may include any suitable conductive material including metals (e.g., Ti, Ta, Co, W, Al, Ni, Cu, Co, etc.), metal nitrides, metal silicon nitrides, and/or other suitable materials. In one such embodiment, the contact liner 230 includes TiN. The contact fill 232 may include any suitable material including metals (e.g., Co, W, Al, Ta, Ti, Ni, Cu, etc.), metal oxides, metal nitrides and/or combinations thereof, and in some examples, the contact fill 232 includes cobalt and/or tungsten.

Subsequent ILD layers 224 of the interconnect structure 204 may contain conductive lines 234 that extend horizontally in a given layer and/or vias that extend vertically to couple conductive lines 234 in different layers. The conductive lines 234 may each include a liner 236 and a fill material 238 disposed on the liner, which may be substantially similar to the contact liner 230 and the contact fill 232, respectively. Accordingly, the liner 236 may include any suitable conductive material including metals, metal nitrides, metal silicon nitrides, and/or other suitable materials. The fill material 238 may include any suitable conductive material including metals, metal oxides, metal nitrides and/or combinations thereof.

The conductive lines 234 may also include a line cap 240 disposed on the liner 236 and the fill material 238. The line cap 240 may include any suitable conductive material including metals, metal oxides, metal nitrides and/or combinations thereof, and the material of the line cap 240 may be the same or different from the fill material 238. For example, in order to selectively etch the line cap 240 to expose the fill material 238, in some examples, the line cap 240 and the fill material 238 may include different materials with different etch selectivities. In one such example, a conductive line 234 includes a liner 236 that contains TiN, TaN, Ta, Ru, or Co, a fill material 238 that includes W, Cu, Co, Ru, or Mo, and a line cap 240 that includes Co, W or Ru. The line cap 240 may have any suitable thickness, and in various examples, is between about 1 nm and about 5 nm thick.

The conductive lines 234 and vias may be formed layer-by-layer, and the alignment of features in the different layers (e.g., the overlay) may have a significant impact on the functionality and reliability of the finished circuit. Some examples that follow reduce the impact of overly errors by forming conductive lines and vias using selective deposition of materials as explained in more detail below. Because the selective deposition process self-aligns features of one layer to those of the next, selective deposition may reduce or eliminate many types defects such as line breakdown and leakage due to overlay misalignment. For example, selective deposition may create dielectric shapes that mitigate optical overlay errors when using photolithography to define the recesses to etch into the ILD layer 224. Although the examples that follow describe selective deposition in the context of forming an interconnect structure 204, the technique is equally applicable for selectively depositing materials to form any other structure of the workpiece 200 and may provide similar benefits in these applications.

Figure 3A:
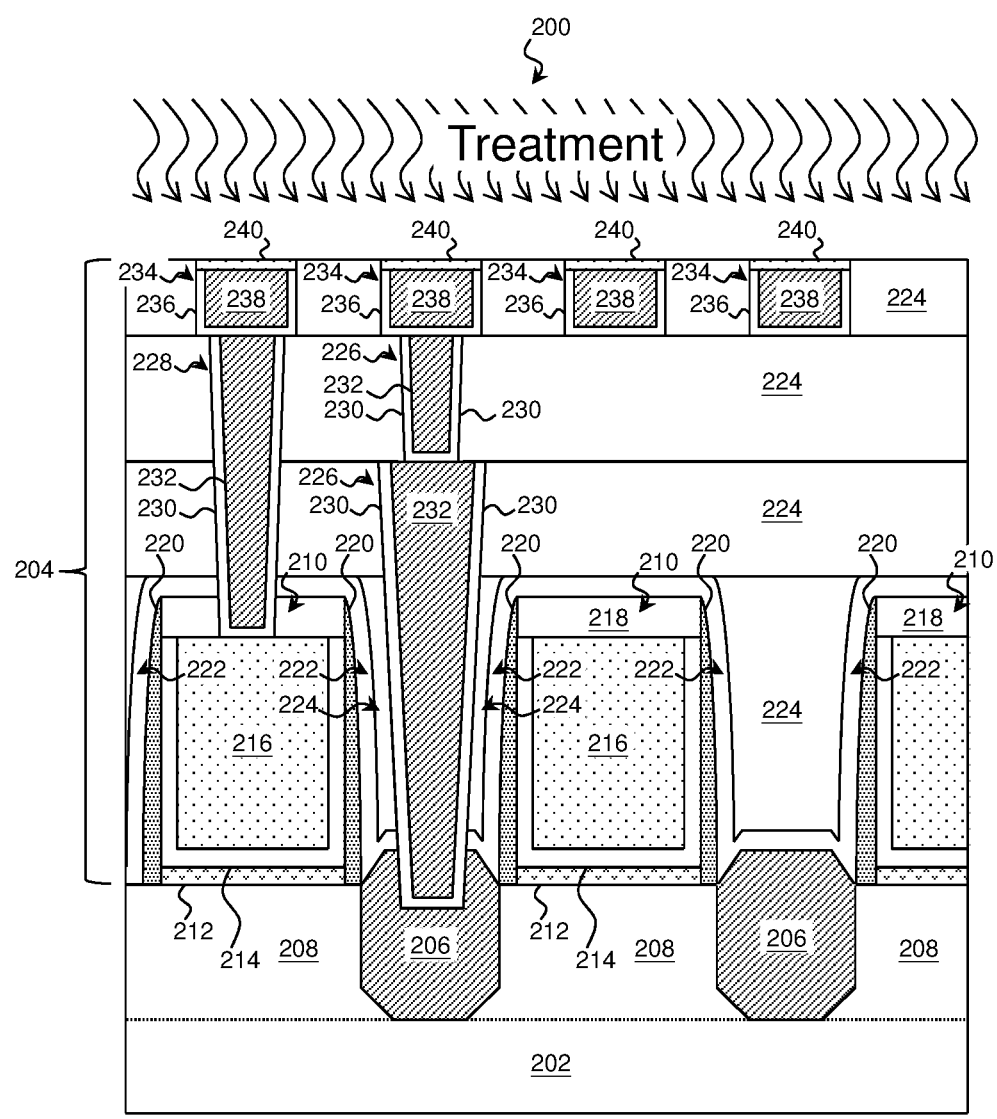

Referring to block 104 of FIG. 1 and to FIG. 3A, a surface treatment is performed on the workpiece 200. The surface treatment may be configured to promote bonding between one or more materials on the top surface of the workpiece 200 (e.g., the line cap 240) and a subsequently deposited blocking layer. For example, a metal-containing line cap 240 may undergo a treatment with oxidizing and/or reducing agents to prepare the topmost surface of the line cap 240 to adhere to the blocking layer. Furthermore, the treatment may be configured to inhibit or at least not promote bonding between the blocking layer and other components of the workpiece 200 (e.g., the ILD layers 224). Thus, the treatment may make the subsequent deposition more material-selective.

In some examples, the surface treatment includes a dry treatment where the workpiece 200 is heated to a temperature between about 100° C. and about 400° C. and exposed to a reducing agent, such as $NH_3$, $N_2$, and/or $H_2$ gas, or an oxidizing agent, such as $O_2$ gas and/or $H_2O$ vapor. In some examples, the surface treatment includes a wet treatment where the workpiece 200 is treated by applying a wet reagent, such as an acid, to the top surface of the workpiece 200. In some examples, the surface treatment includes a plasma treatment performed on the workpiece 200 using $NH_3$, $N_2$, and/or $H_2$ plasma.

Figure 3B:
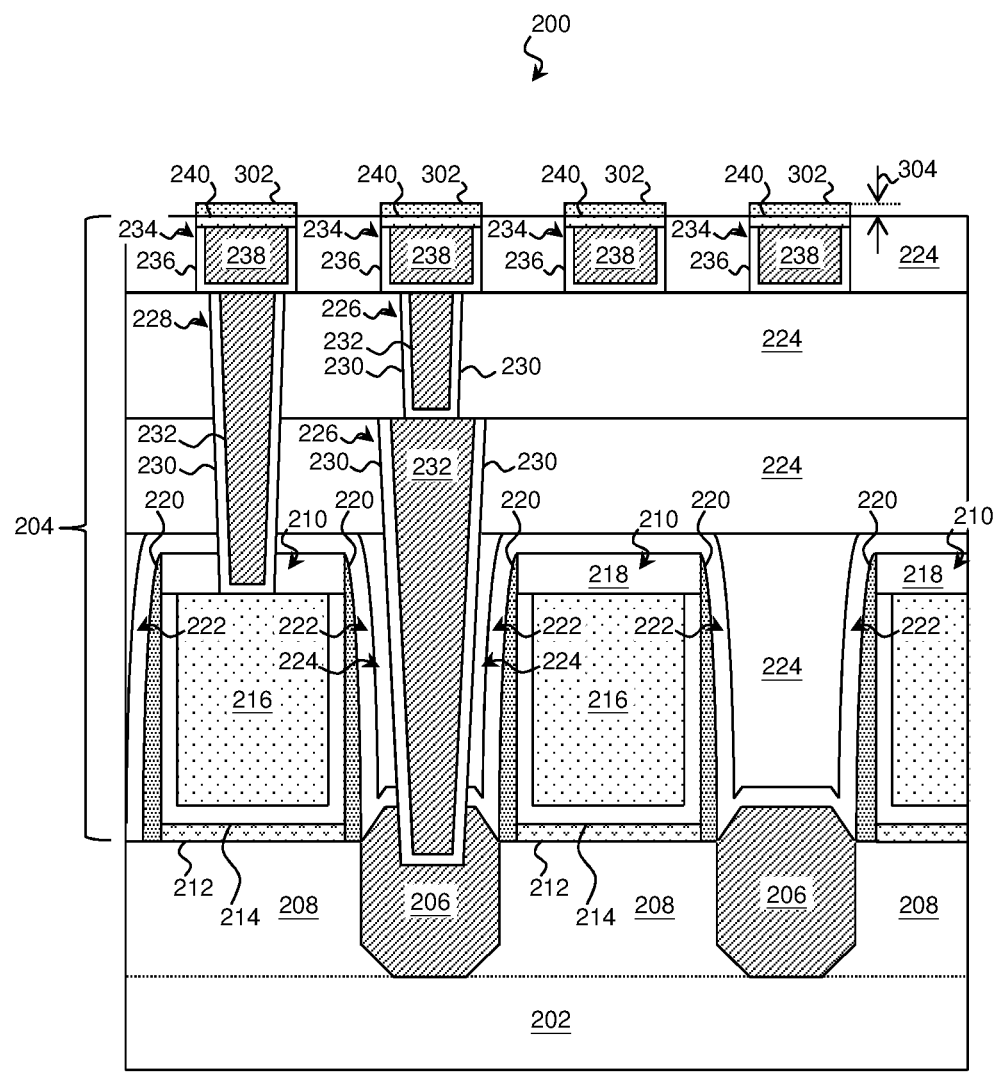

Referring to block 106 of FIG. 1 and to FIG. 3B, a blocking layer 302 is applied to the workpiece 200. The blocking layer 302 is configured to bond to selected materials of the workpiece 200 without bonding to others. The surface treatment of block 104 may promote the selective bonding of the blocking layer 302. In some examples, the blocking layer 302 is configured to bond to the line cap 240, assisted by the surface treatment of block 104, without bonding to the ILD layer 224. To assist in this bonding, the blocking layer 302 may include a head group, such as a thiol group, a sulfonic acid group, phosphonate group, a phosphonic acid group, a thiazole group, an imidazole group, a triazole group, a pyrimidine group, a thiazine group, an amine group, or a tetrazole group, that is configured to bond to an oxidized or reduced surface of the line cap 240. In some embodiments, the head group may include a functional group that contains sulfur, phosphorous, nitrogen, and oxygen.

The blocking layer 302 may include a tail group bonded to the head group. In some implementations, the tail group may be a steric hindrance group, such as a saturated or unsaturated hydrocarbon, that is configured to inhibit the application of these subsequent layers. In some examples, the tail group may include branched or cyclic hydrocarbons Where the blocking layer 302 bonds via the head group, the tail group bonded to the head group may prevent the formation or adhesion of subsequent layers. Example blocking layer 302 may include one or more of 1-octadecanethiol, 1-dodecanethiol, stearic acid, 4-dodecylbenzenesulfonic acid, dimethyl octadecylphosphonate, bi(dodecyl) dithiophosphinic acids, bi(octadecyl) dithiophosphinic acids, diethyl-n-octadecylphosphonate, octadecylphosphonic acid, decylphosphonic acid, tetradecylphosphonic acid, 2-mercaptobenzothiazole, 2-mercaptobenzoxazole, 2-mercaptobenzimidazole, benzothiazol, benzoxazole, benzimidazole, 2-methylbenzimidazole, 5,6-dimethylbenzimidazole, 2-(methylthio)benzimidazole, 1,2,3-triazole, 1,2,4-triazole, 3-Amino-1,2,4-triazole, 1-hydroxybenzotriazole hydrate, 4-methyl-1H-benzotriazole, 5-methyl-1H-benzotriazole, 5,6-dimethyl-1H-benzotriazole, 4-hydroxy-1H-benzotriazole, benzotriazole-l-carboxamide, 2-methylbenzothiazole, imidazole, methimazole, 5-phenyl-1H-tetrazole, benzotriazole, 5-(3-aminophenyl)tetrazole, 4-amino-4H-1,2,4-triazole, 3-amino-5-mercapto-1,2,4-triazole, 3-amino-5-methylthio-1H-1,2,4-triazole, 2-aminopyrimidine, 2-mercaptopyrimidine, adenine, hypoxanthine, morpholine, 5-amino-1,3,4-thiadiazole-2-thiol, tryptophan, histidine, 5-(trifluoromethyl)-1H-1,2,3-benzotriazole, 1H-benzotriazole,1-(4-morpholinylmethyl), phenothiazine, purine, melamine, trithiocyanuric acid, 1,3,4-thiadiazole-2,5-diamine, 3,5-diamino-1,2,4-triazole, 5-aminotetrazole, 3,6-bis(methylthio)-1,2,4,5-tetrazine, and aminophylline.

The blocking layer 302 may be applied by any suitable process including vapor deposition, spin coating, or dip coating, and may be formed to any suitable thickness 304. In various examples, the thickness 304 ranges from a single monolayer (e.g., as little as 1 Å) to about 10 nm. In one such example, the deposition technique forms a single monolayer of the blocking layer 302 on the line caps 240 of the conductive lines 234 without forming the blocking layer 302 on the ILD layer 224.

Figure 4:
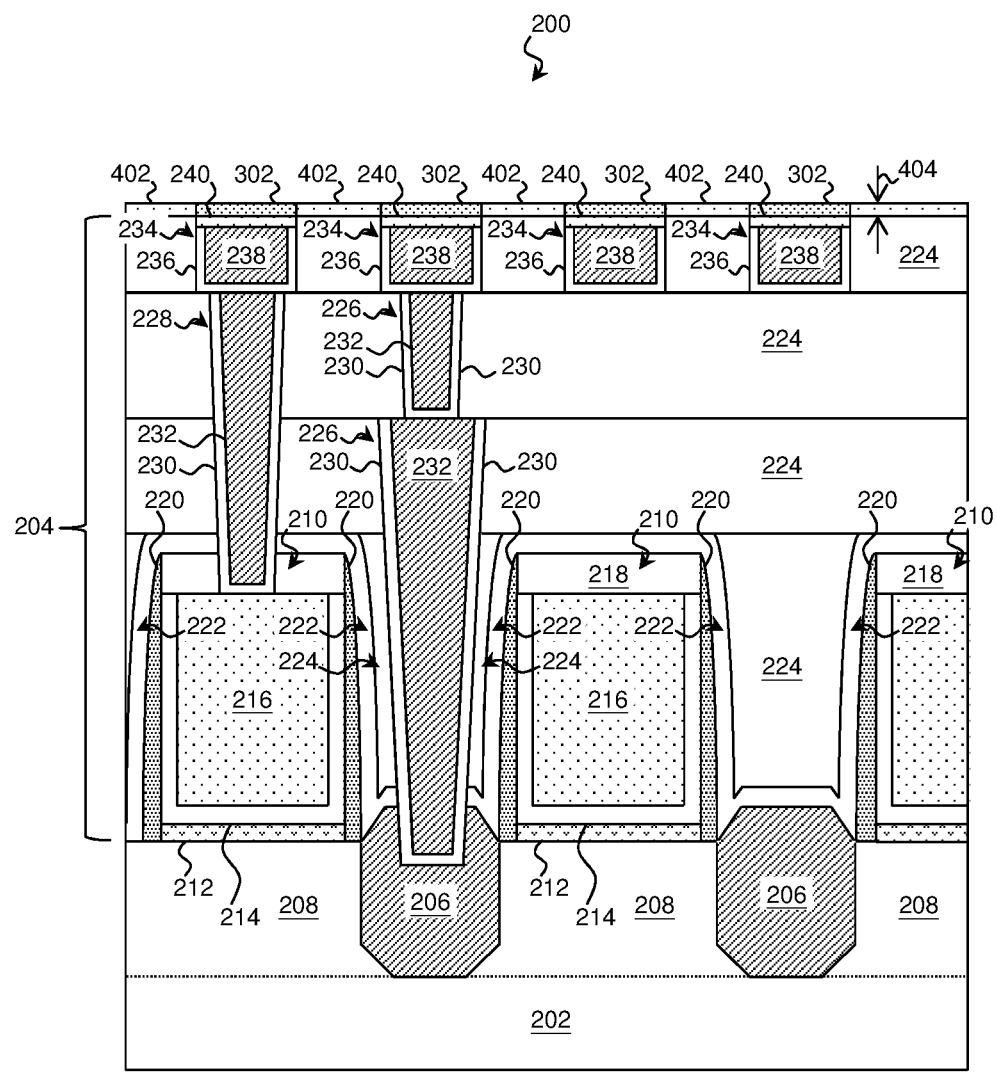

Referring to block 108 of FIG. 1 and to FIG. 4, a catalyst 402 that promotes formation of a dielectric is formed on the ILD layer 224 of the workpiece 200. The presence of the blocking layer 302 may prevent the catalyst 402 from being deposited on other portions of the workpiece 200, such as the conductive lines 234. The catalyst 402 may include a metal (e.g., Al, Ti, Zr, Hf, Y) and/or metal oxide, and the material of the catalyst 402 may be selected based on the composition of the dielectric it promotes. The catalyst 402 may be formed by any suitable process including ALD, PEALD, CVD, PECVD, HDP-CVD, spin-on deposition, and/or other suitable deposition processes. The catalyst 402 may be formed to any suitable thickness 404, and in an example, is a single monolayer thick (e.g., between about 1 ∈ and about 5 Å) thick.

Figure 5:
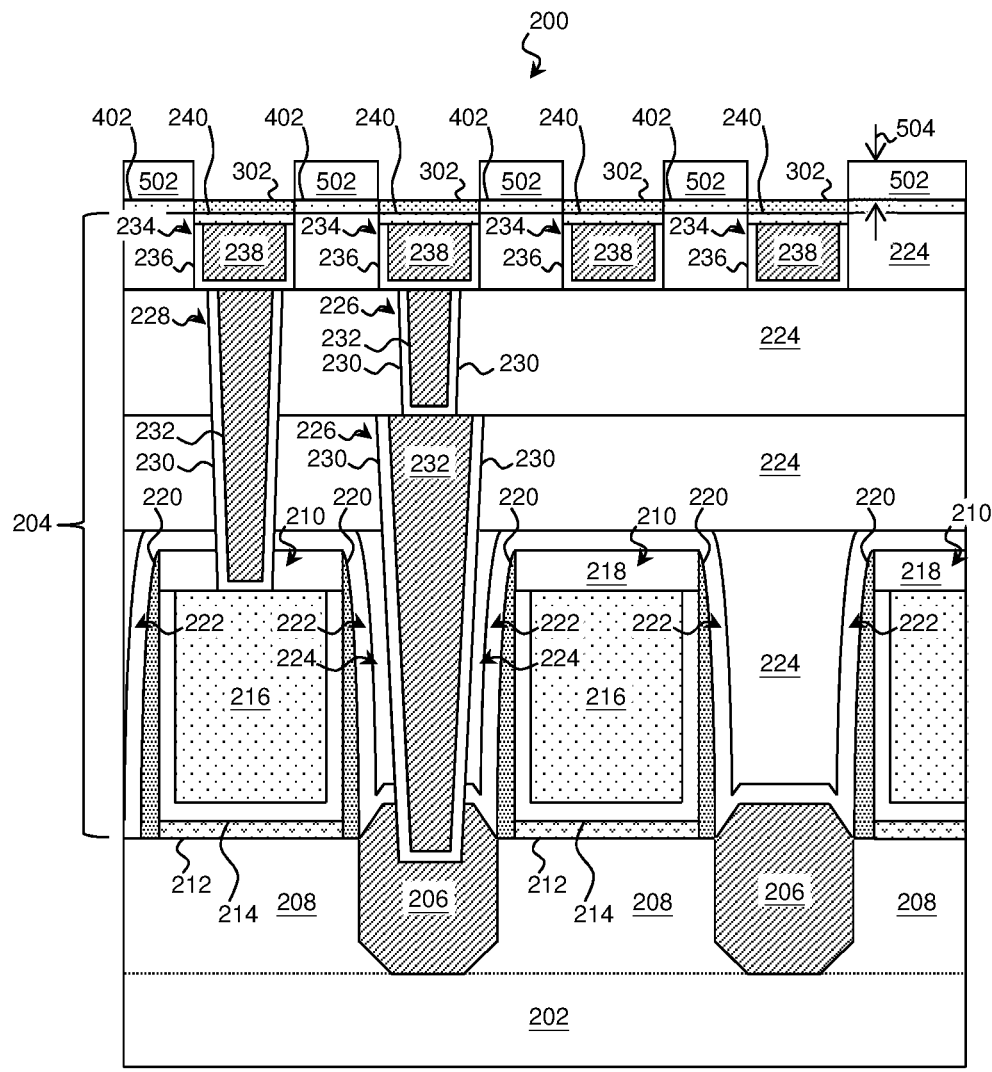

Referring to block 110 of FIG. 1 and to FIG. 5, dielectric alignment features 502 are formed on the catalyst 402 without being formed on the blocking layer 302. In particular, the catalyst 402 may promote the formation of the alignment features 502, while the blocking layer 302 may inhibit it. The alignment features 502 may include one or more dielectric materials, which are commonly characterized by their dielectric constant relative to silicon dioxide. In some embodiments, the alignment features 502 include silicon oxide ($SiO_x$), a low-k dielectric material (e.g., SiCOH), another semiconductor oxide, semiconductor nitride, semiconductor oxynitride, semiconductor carbide, amorphous carbon, other suitable dielectric material, and/or combinations thereof.

The dielectric alignment features 502 may be formed using any suitable process including ALD, PEALD, CVD, PECVD, HDP-CVD, spin-on deposition, and/or other suitable deposition processes. In some examples, the alignment features 502 are deposited using CVD with alkoxy silanol and/or aryloxy silanol precursors. The deposition process may form the alignment features 502 to any suitable thickness 504, and in various examples, the alignment features have a thickness 504 between about 2 nm and about 10 nm. The thickness of the alignment features 502 may prevent inadvertent etching of the underlying ILD layer 224 when etching recesses for subsequent conductive features. As shown in subsequent figures, the thickness of the alignment features 502 may also reduce the capacitance between a via and an adjacent conductive line 234 by increasing the distance between the via and the adjacent conductive line 234.

Figure 6:
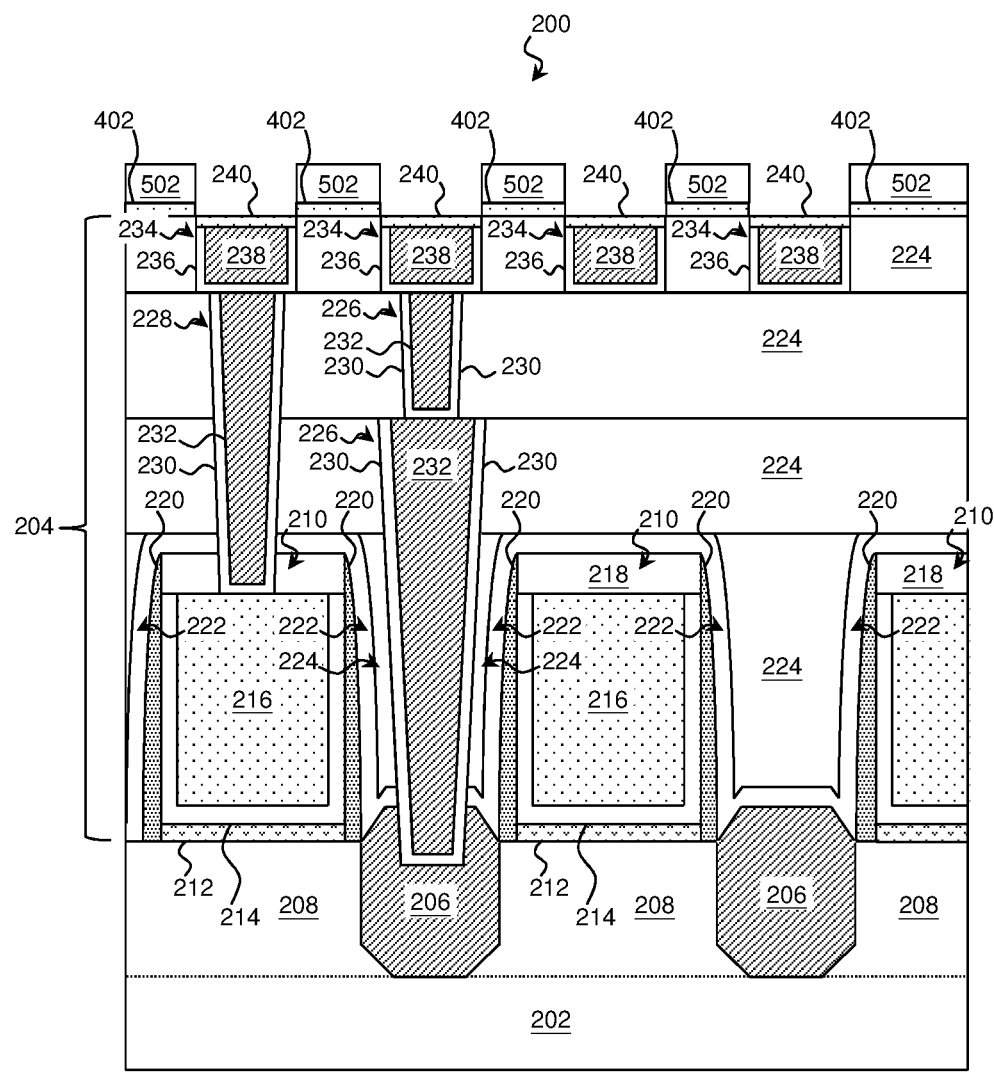

Referring to block 112 of FIG. 1 and to FIG. 6, the blocking layer 302 is removed from the workpiece 200, which may expose the underlying line caps 240. The blocking layer 302 may be removed using any suitable etching technique including wet etching, dry etching, RIE, and/or other etching methods. The etching technique and etching chemistry may be configured to avoid significant etching of the alignment features 502, the line cap 240, and/or other materials of the workpiece 200.

Figure 7:
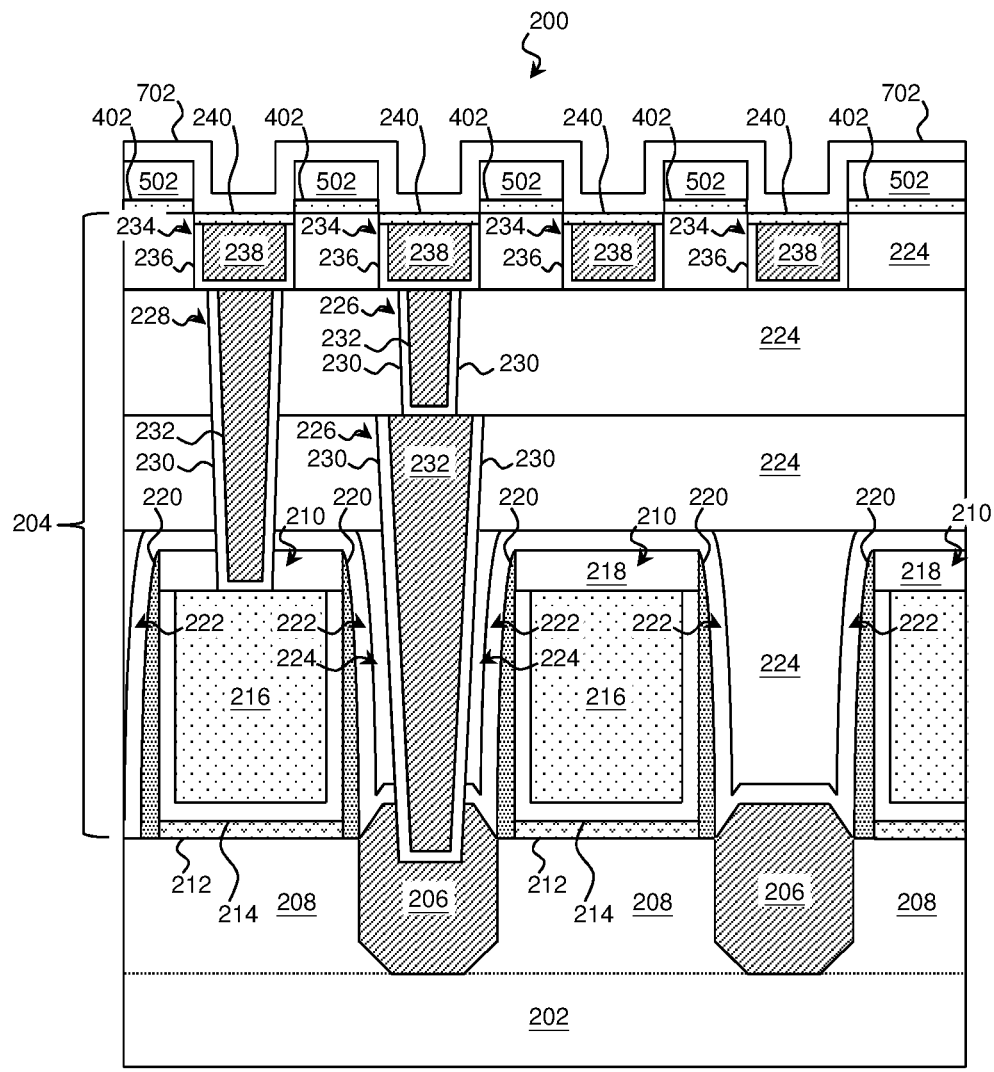

Referring to block 114 of FIG. 1 and to FIG. 7, an etch-stop layer 702 is formed on the top and sides of the dielectric alignment features 502 and on top of the line cap 240. The etch-stop layer 702 may include a metal (e.g., Al, Ti, Zr, Hf, Y), a metal oxide, a dielectric (e.g., a semiconductor oxide, a semiconductor nitride, a semiconductor oxynitride, a semiconductor carbide, etc.) and/or other suitable material. As the etch-stop layer 702 provides protection from over etching during the etching of the dielectric alignment features 502 and a subsequent ILD layer, the composition of the etch-stop layer 702 may be selected to have a different etch selectivity than these layers (e.g., an etching rate less than about ⅙ to ¹⁄₁₀ that of the dielectric alignment features 502 and the ILD layer 802 of FIG. 8). The etch-stop layer 702 may be formed using any suitable process including ALD, PEALD, CVD, PECVD, HDP-CVD, spin-on deposition, and/or other suitable deposition processes. The etch-stop layer 702 may be formed to any suitable thickness, and in some examples, the etch-stop layer 702 has a thickness between about 1 nm and about 10 nm.

Figure 8:
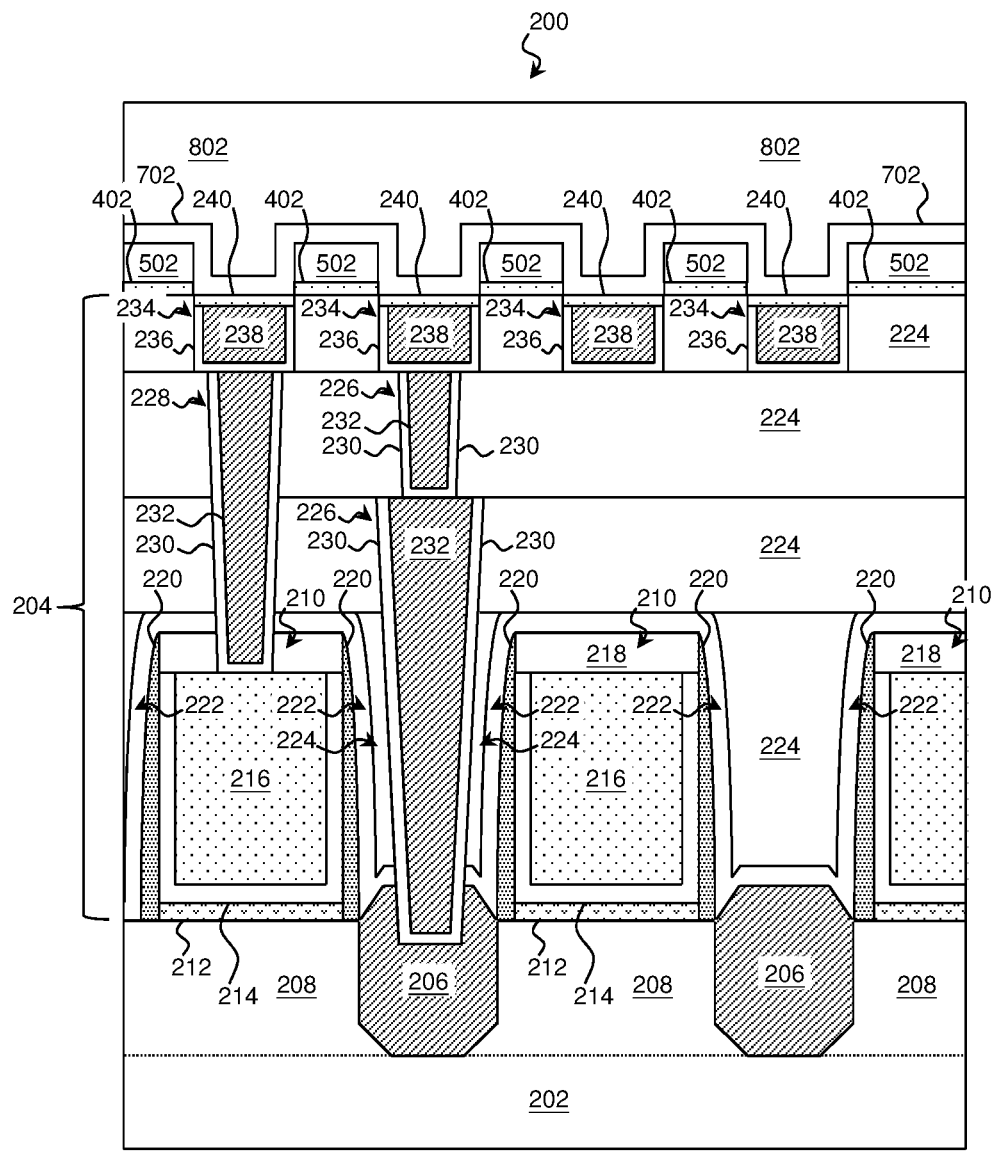

Referring to block 116 of FIG. 1 and to FIG. 8, an ILD layer 802 is formed on the etch-stop layer 702 over both the dielectric alignment features 502 and the conductive lines 234. The ILD layer 802 may be substantially similar to the other ILD layers 224 and may include any suitable dielectric material, such as a semiconductor oxide, a semiconductor nitride, a semiconductor oxynitride, a semiconductor carbide, TEOS oxide, PSG, BPSG, FSG, carbon doped silicon oxide, Black Diamond®, Xerogel, Aerogel, amorphous fluorinated carbon, Parylene, BCB, SiLK®, polyimide, other suitable materials, and/or combinations thereof. The ILD layer 802 may be formed using any suitable process including CVD, PECVD, HDP-CVD, ALD, PEALD, spin-on deposition, and/or other suitable deposition processes.

Figure 9:
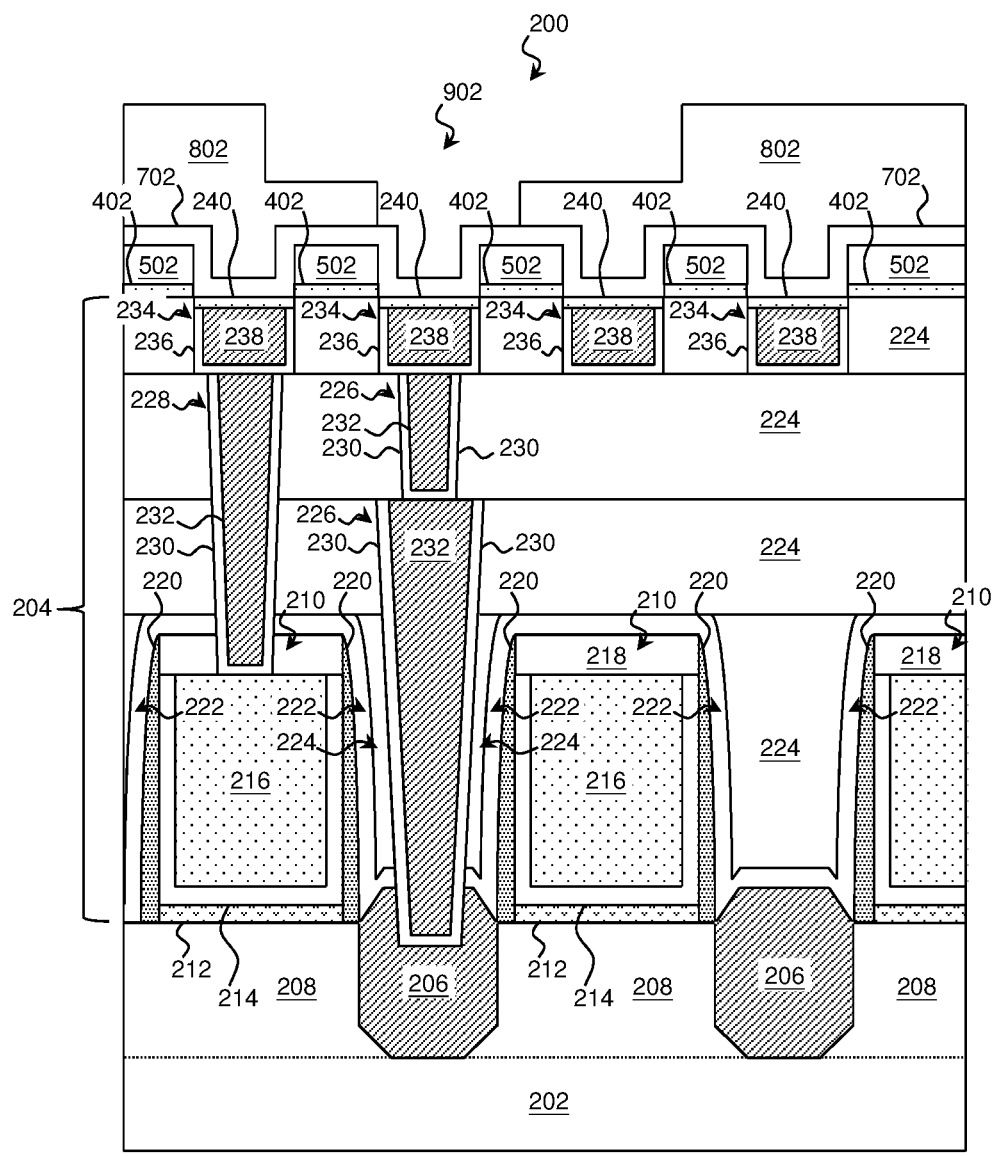
Figure 10:
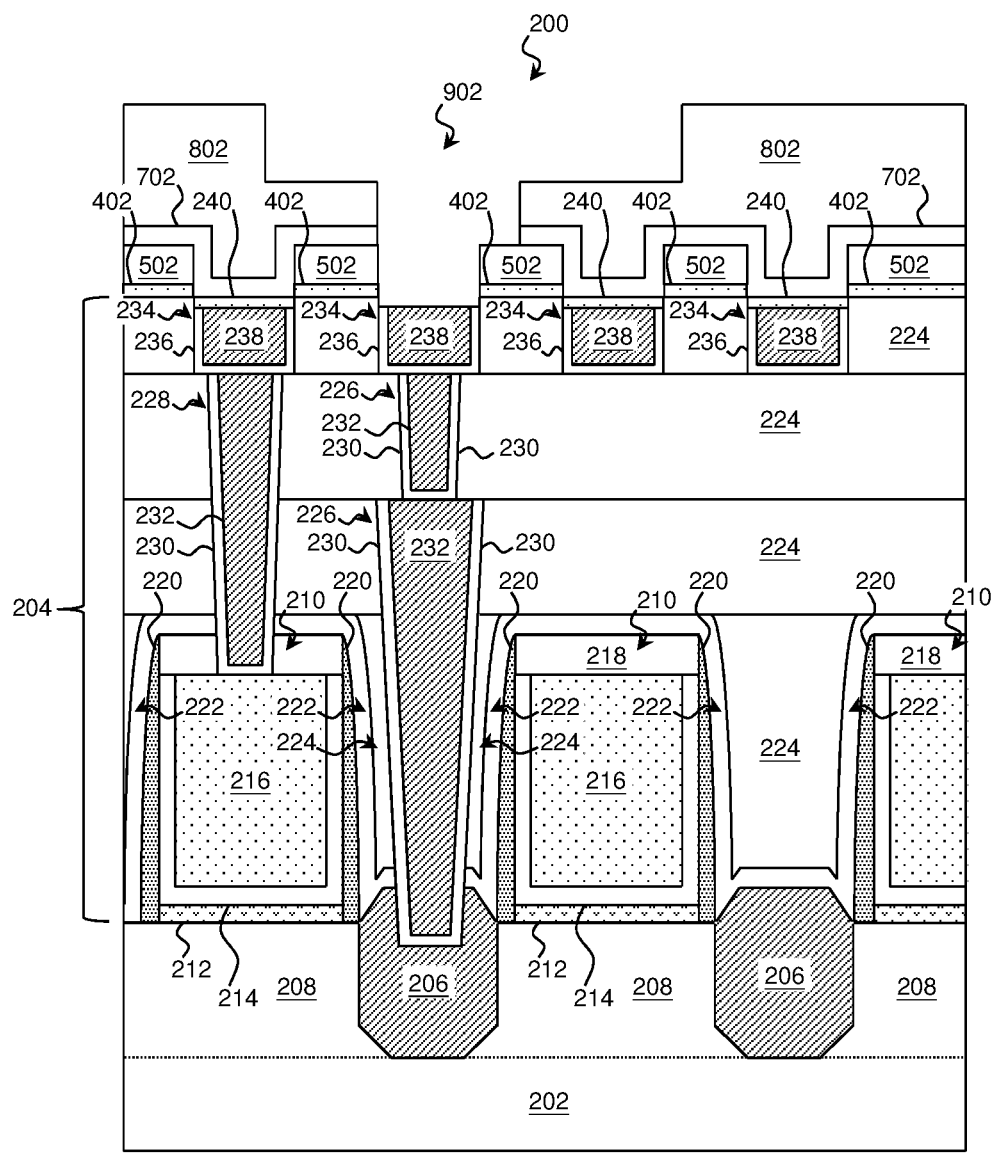

Referring to block 118 of FIG. 1 and to FIG. 9, the ILD layer 802 is patterned to form recesses 902 in which to form conductive lines and/or vias. The conductive lines and vias may be formed separately or concurrently in a single- or dual-damascene process. In a single damascene process, the vias and conductive lines may be formed separately. For example, the ILD layer 802 may be etched to define the vias, the vias may be deposited, and another ILD layer may be formed and patterned to define the conductive lines. In a dual damascene process, a single ILD layer 802 may be etched (using one or more etching processes) to define recesses for both vias and conductive lines, and the conductive material for both types of features are deposited in the same process.

In an example of a dual-damascene process, a first photoresist is formed on the workpiece 200 and patterned in a photolithographic process to selectively expose portions of the ILD layer 802 to etch to define the vias. A photolithographic system exposes the photoresist to radiation in a particular pattern determined by a mask. Light passing through or reflecting off the mask strikes the photoresist thereby transferring a pattern formed on the mask to the photoresist. Additionally or in the alternative, the photoresist may be exposed using a direct write or maskless lithographic technique, such as laser patterning, e-beam patterning, and/or ion-beam patterning. Once exposed, the photoresist is developed, leaving the exposed portions of the resist, or in alternative examples, leaving the unexposed portions of the resist. An exemplary patterning process includes soft baking of the photoresist, mask aligning, exposure, post-exposure baking, developing the photoresist, rinsing, and drying (e.g., hard baking).

The portions of the ILD layer 802 exposed by the photoresist are then etched using any suitable etching technique such as wet etching, dry etching, RIE, and/or other etching methods. In some embodiments, the etching process includes dry etching using an oxygen-based etchant, a fluorine-based etchant (e.g., $CF_4$, $SF_6$, $CH_2F_2$, $CHF_3$, and/or $C_2F_6$), a chlorine-based etchant (e.g., $Cl_2$, $CHCl_3$, $CCl_4$, and/or $BCl_3$), a bromine-based etchant (e.g., HBr and/or $CHBR_3$), an iodine-based etchant, other suitable etchant gases or plasmas, and/or combinations thereof. In some examples, the etching of the ILD layer 802 etches the entire thickness of the ILD layer so that the etch-stop layer 702 is exposed where vias are to be formed. In other examples, this first etching removes only a portion of the thickness of the ILD layer 802 where vias are to be formed, and a subsequent etching that expands the recesses horizontally to form conductive lines also expands the via recesses vertically. After etching, any remaining photoresist may be removed.

A second photoresist is then formed on the workpiece 200 and patterned in a photolithographic process to selectively expose portions of the ILD layer 802 to etch to define the conductive lines. The portions of the ILD layer 802 exposed by the photoresist are etched using any suitable etching technique such as wet etching, dry etching, RIE, and/or other etching methods. After etching, any remaining photoresist may be removed. The two iterations of photolithographic patterning and etching form the recesses 902 shown in FIG. 9, although any other suitable technique for forming the recesses 902 may be used.

The patterning of block 118 may expose a portion of the etch-stop layer 702 over the conductive line 234 where a via is to be formed. Where a via extends beyond a conductive line 234, by error or design, the recess may also expose a portion of the etch-stop layer 702 over the dielectric alignment features 502. Referring to block 120 of FIG. 1 and to FIG. 10, the exposed etch-stop layer 702 is removed using any suitable etching technique such as wet etching, dry etching, RIE, and/or other etching methods. The etching of the etch-stop layer 702 may also remove the line cap 240 of the underlying conductive line 234 or another etching process may be performed to etch the line cap 240. In contrast, the etching technique(s) and chemistries are selected to avoid significant etching of the ILD layer 802, the dielectric alignment features 502, the liner 236, the fill material 238, and other materials of the workpiece 200.

Figure 11:
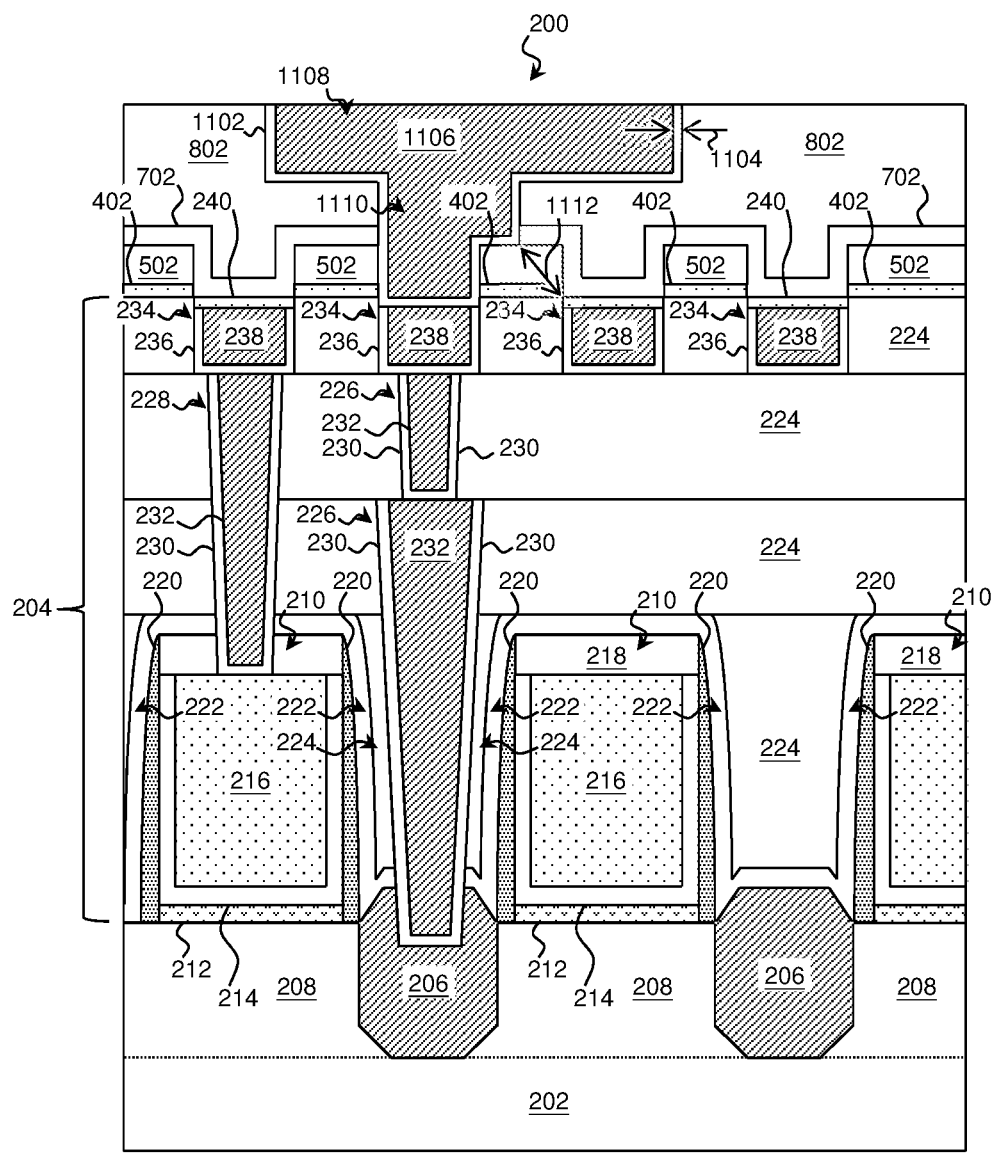

Referring to block 122 of FIG. 1 and to FIG. 11, a liner 1102 is formed in the recess 902 that physically and electrically couples to the underlying conductive line 234. The liner 1102 may be substantially similar to the liner 236 and may include any suitable conductive material including metals, metal nitrides, metal silicon nitrides, and/or other suitable materials. The liner 1102 may be formed using any suitable process including ALD, PEALD, CVD, PECVD, HDP-CVD, and/or other suitable deposition processes and may be formed to any suitable thickness, and in various examples, the liner 1102 has a thickness 1104 between about 1 nm and about 5 nm.

Referring to block 124 of FIG. 1 and referring still to FIG. 11, a conductive fill 1106 is formed in the recess 902 on the liner 1102. The conductive fill 1106 may be substantially similar to the fill material 238 above, and may include any suitable conductive material including metals, metal oxides, metal nitrides, and/or other suitable materials. The conductive fill 1106 may be formed using any suitable process including ALD, PEALD, CVD, PECVD, HDP-CVD, Physical Vapor Deposition (PVD), and/or other suitable deposition processes.

The conductive fill 1106 and the liner 1102 form another conductive line 1108 and a via 1110 extending between the conductive lines 1108 and 234. In the example of FIG. 11, the via 1110 extends beyond the underlying conductive line 234 to which it couples in part because the via 1110 is wider than the conductive line 234 and in part because of a degree of overlay error. However, the dielectric alignment features 502 adjacent the conductive line 234 help align the lower portion of the via 1110. This may allow for wider vias 1110, which in turn, may reduce sensitivity to overlay error. In various embodiments, the width of the via 1110 is up, but less than, about 2 times the width of the conductive line 234 to which it couples.

The dielectric alignment features 502 may also increases the spacing 1112 between the via 1110 and adjacent conductive lines 234. This increased spacing 1112 may reduce undesirable effects such as leakage between the two circuits and line breakdown. The increased spacing 1112 may also reduce parasitic coupling capacitance. Thus, even though a via 1110 is wider than a conductive line 234, the portion of the via 1110 that extends beyond the conductive line 234 safely terminates at a dielectric alignment feature 502, which reduces coupling between the via 1110 and an adjacent conductive line 234 and avoids defects such as shorts, leakage, and line breakdown.

A CMP process may be performed on the workpiece 200 to remove any material of the conductive fill 1106 and/or the liner 1102 that extends above the top of the ILD layer 802.

Figure 12:
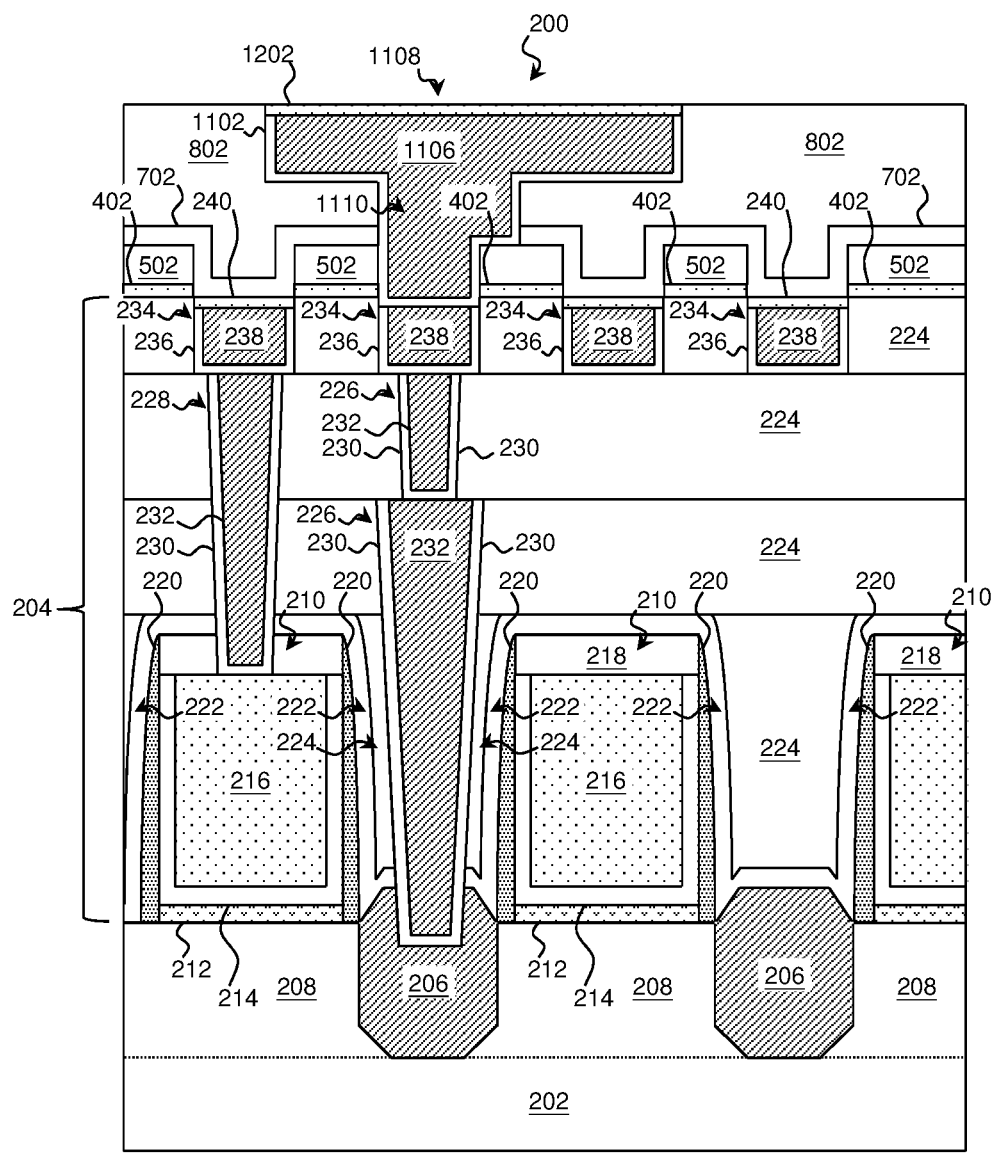

Referring to block 126 of FIG. 1 and to FIG. 12, a line cap 1202 may be formed on the conductive line 1108 by first recessing the liner 1102 and the conductive fill 1106. This may include etching the liner 1102 and the conductive fill 1106 using any suitable etching technique, such as wet etching, dry etching, RIE, and/or other etching methods, so that the top of the liner 1102 and the conductive fill 1106 is below the top of the ILD layer 802. The line cap 1202 may then be deposited on the recessed liner 1102 and conductive fill 1106. The line cap 1202 may be substantially similar to the line cap 240 above and may be deposited by any suitable process including ALD, PEALD, CVD, PECVD, HDP-CVD, and/or other suitable deposition processes. The line cap 1202 may be formed to any suitable thickness, and in various examples, the line cap 1202 has a thickness between about 1 nm and about 5 nm. After depositing the line cap 1202 material, a CMP process may be performed on the workpiece 200 to remove any material that extends above the top of the ILD layer 802.

The workpiece 200 may then be provided for further fabrication. In various examples, this includes forming a remainder of an electrical interconnect structure, dicing, packaging, and other fabrication processes.

Thus, the present disclosure provides examples of an integrated circuit with an interconnect structure and a method for forming the integrated circuit. In some embodiments, a method of forming an integrated circuit device includes receiving a workpiece that includes a substrate and an interconnect structure disposed on the substrate. The interconnect structure includes a first conductive feature disposed within a first inter-level dielectric layer. A blocking layer is selectively formed on the first conductive feature without forming the blocking layer on the first inter-level dielectric layer. An alignment feature is selectively formed on the first inter-level dielectric layer without forming the alignment feature on the blocking layer. The blocking layer is removed from the first conductive feature, and a second inter-level dielectric layer is formed on the alignment feature and on the first conductive feature. The second inter-level dielectric layer is patterned to define a recess for a second conductive feature, and the second conductive feature is formed within the recess such that the second conductive feature extends to the first conductive feature. In some such embodiments, a surface treatment is performed on a top surface of the first conductive feature that promotes the forming of the blocking layer on the first conductive feature without forming the blocking layer on the first inter-level dielectric layer. In some such embodiments, the surface treatment applies a reagent from a group consisting of an oxidizing agent and a reducing agent to the top surface of the first conductive feature. In some such embodiments, the surface treatment applies a reagent from a group consisting of: $NH_3$, $N_2$, $H_2$, $O_2$, and $H_2O$ to the top surface of the first conductive feature. In some such embodiments, the blocking layer includes a material with a head group from a group consisting of: phosphorus, sulfur, and silicon that is configured to bond to a top surface of the first conductive feature. In some such embodiments, the forming of the alignment feature includes forming a catalyst on the first inter-level dielectric layer that inhibits formation of the catalyst on the first conductive feature and forming the alignment feature on the catalyst. In some such embodiments, the catalyst includes a material from a group consisting of: a metal and a metal oxide. In some such embodiments, the second conductive feature includes a via that includes a first portion that extends to and physically couples to the conductive feature and a second portion that extends to the alignment feature. In some such embodiments, the interconnect structure includes a third conductive feature disposed within the first inter-level dielectric layer such that the alignment feature is disposed between and physically separates the second portion of the via from the third conductive feature. In some such embodiments, an etch stop layer is formed on a top surface of the first conductive feature and on a top surface and side surfaces of the alignment feature, and the second inter-level dielectric layer is formed on the etch stop layer.

In further embodiments, a method includes receiving a workpiece that includes an interconnect structure. The interconnect structure includes a first conductive line disposed within a first inter-level dielectric layer. The first conductive line includes a first liner, a first conductive fill disposed on the first liner, and a cap disposed on the first liner and on the first conductive fill. A surface treatment is performed on the cap. A blocking layer is formed on the cap without forming the blocking layer on the first inter-level dielectric layer, and the surface treatment is configured to promote bonding between the cap and the blocking layer. A dielectric layer is formed on the first inter-level dielectric layer and alongside the blocking layer, and the blocking layer is removed to expose the cap of the first conductive line. A second inter-level dielectric layer is formed on the first conductive line and on the dielectric layer. A via is formed in the second inter-level dielectric layer that couples to the first conductive line. In some such embodiments, a first portion of the via couples to the first conductive line, and a second portion of the via couples to a top surface of the dielectric layer. In some such embodiments, the forming of the via includes forming a second conductive line on the via such that the via electrically couples the second conductive line to the first conductive line. In some such embodiments, the surface treatment applies a reagent from a group consisting of: an oxidizing agent and a reducing agent to a top surface of the cap. In some such embodiments, the forming of the dielectric layer includes forming a catalyst on the first inter-level dielectric layer that inhibits formation of the catalyst on the first conductive line and forming the dielectric layer on the catalyst. In some such embodiments, the blocking layer includes a material with a head group from a group consisting of: phosphorus, sulfur, and silicon and a tail group configured to inhibit the forming of the catalyst on the blocking layer.

In yet further embodiments, an integrated circuit device includes a first conductive feature, a first inter-level dielectric layer disposed alongside the first conductive feature, an alignment feature disposed on the first inter-level dielectric layer, a second conductive feature disposed on the first conductive feature and the alignment feature, and a second inter-level dielectric layer disposed alongside the second conductive feature. In some such embodiments, the second conductive feature physically couples to a top surface of the first conductive feature and a top surface of the alignment feature. In some such embodiments, the integrated circuit device further includes a third conductive feature disposed alongside the first inter-level dielectric layer. The alignment feature is disposed between the second conductive feature and the third conductive feature. In some such embodiments, integrated circuit device further includes a catalyst disposed between the first inter-level dielectric layer and the alignment feature, and the catalyst includes a material from a group consisting of a metal and a metal oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit device, comprising:
   receiving a workpiece that includes a substrate and an interconnect structure disposed on the substrate, wherein the interconnect structure includes a first conductive feature disposed within a first inter-level dielectric layer;
   selectively forming a blocking layer on the first conductive feature without forming the blocking layer on the first inter-level dielectric layer;
   selectively forming an alignment feature on the first inter-level dielectric layer without forming the alignment feature on the blocking layer;
   removing the blocking layer from the first conductive feature;
   forming a second inter-level dielectric layer on the alignment feature and on the first conductive feature;
   patterning the second inter-level dielectric layer to define a recess for a second conductive feature; and
   forming the second conductive feature within the recess such that the second conductive feature extends to the first conductive feature.

2. The method of claim 1, further comprising performing a surface treatment on a top surface of the first conductive feature, wherein the surface treatment promotes the forming of the blocking layer on the first conductive feature without forming the blocking layer on the first inter-level dielectric layer.

3. The method of claim 2, wherein the surface treatment applies a reagent from a group consisting of: an oxidizing agent and a reducing agent to the top surface of the first conductive feature.

4. The method of claim 2, wherein the surface treatment applies a reagent from a group consisting of: $NH_3$, $N_2$, $H_2$, $O_2$, and $H_2O$ to the top surface of the first conductive feature.

5. The method of claim 1, wherein the blocking layer includes a material with a head group from a group consisting of: phosphorus, sulfur, and silicon that is configured to bond to a top surface of the first conductive feature.

6. The method of claim 1, wherein the forming of the alignment feature includes:
   forming a catalyst on the first inter-level dielectric layer, wherein the blocking layer inhibits formation of the catalyst on the first conductive feature; and
   forming the alignment feature on the catalyst.

7. The method of claim 6, wherein the catalyst includes a material from a group consisting of: a metal and a metal oxide.

8. The method of claim 1, wherein the second conductive feature includes a via that includes a first portion that extends to and physically couples to the first conductive feature and a second portion that extends to the alignment feature.

9. The method of claim 8, wherein the interconnect structure includes a third conductive feature disposed within the first inter-level dielectric layer such that the alignment feature is disposed between and physically separates the second portion of the via from the third conductive feature.

10. The method of claim 1, further comprising forming an etch stop layer disposed on a top surface of the first conductive feature and on a top surface and side surfaces of the alignment feature, wherein the second inter-level dielectric layer is formed on the etch stop layer.

11. A method, comprising:
    receiving a workpiece that includes an interconnect structure, wherein the interconnect structure includes a first conductive line disposed within a first inter-level dielectric layer, and wherein the first conductive line includes a first liner, a first conductive fill disposed on the first liner, and a cap disposed on the first liner and on the first conductive fill;
    performing a surface treatment on the cap;
    forming a blocking layer on the cap without forming the blocking layer on the first inter-level dielectric layer, wherein the surface treatment is configured to promote bonding between the cap and the blocking layer;
    forming a dielectric layer on the first inter-level dielectric layer and alongside the blocking layer;
    removing the blocking layer to expose the cap;
    forming a second inter-level dielectric layer on the first conductive line and on the dielectric layer; and
    forming a via in the second inter-level dielectric layer that couples to the first conductive line.

12. The method of claim 11, wherein a first portion of the via couples to the first conductive line and a second portion of the via couples to a top surface of the dielectric layer.

13. The method of claim 11, wherein the forming of the via includes forming a second conductive line on the via such that the via electrically couples the second conductive line to the first conductive line.

14. The method of claim 11, wherein the surface treatment applies a reagent from a group consisting of: an oxidizing agent and a reducing agent to a top surface of the cap.

15. The method of claim 11, wherein the forming of the dielectric layer includes:
 forming a catalyst on the first inter-level dielectric layer, wherein the blocking layer inhibits formation of the catalyst on the first conductive line; and
 forming the dielectric layer on the catalyst.

16. The method of claim 15, wherein the blocking layer includes a material with a head group from a group consisting of: phosphorus, sulfur, and silicon and a tail group configured to inhibit the forming of the catalyst on the blocking layer.

17. An integrated circuit device, comprising:
 a first conductive feature;
 a first inter-level dielectric layer disposed alongside the first conductive feature;
 an alignment feature disposed on the first inter-level dielectric layer;
 an etch stop layer disposed on a top surface and sidewalls of the alignment feature;
 a second conductive feature disposed on the first conductive feature and the alignment feature; and
 a second inter-level dielectric layer disposed alongside the second conductive feature and over the etch stop layer.

18. The integrated circuit device of claim 17, wherein the second conductive feature physically couples to a top surface of the first conductive feature and a top surface of the alignment feature.

19. The integrated circuit device of claim 17, further comprising a third conductive feature disposed alongside the first inter-level dielectric layer, wherein the alignment feature is disposed between the second conductive feature and the third conductive feature and the etch stop layer extends over a top surface of the third conductive feature.

20. The integrated circuit device of claim 17, further comprising a catalyst disposed between the first inter-level dielectric layer and the alignment feature, wherein the catalyst includes a material from a group consisting of a metal and a metal oxide.

\* \* \* \* \*